(12) United States Patent
Tomsio

(10) Patent No.: US 6,788,125 B1
(45) Date of Patent: Sep. 7, 2004

(54) STABLE AND ACCURATE CMOS LEVEL SHIFTER

(75) Inventor: Nayon Tomsio, Austin, TX (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/446,477

(22) Filed: May 28, 2003

(51) Int. Cl.[7] .............................................. H03L 5/00
(52) U.S. Cl. ...................................................... 327/333
(58) Field of Search .......................... 327/310, 317–319, 327/327–328, 331, 333; 326/80–81

(56) References Cited

U.S. PATENT DOCUMENTS

| | | | | |
|---|---|---|---|---|
| 6,236,244 B1 | * | 5/2001 | Depetro et al. | 327/108 |
| 6,331,797 B1 | * | 12/2001 | Lambert | 327/333 |
| 6,445,622 B1 | * | 9/2002 | Hirano | 365/189.11 |
| 6,566,930 B1 | * | 5/2003 | Sato | 327/333 |
| 6,600,357 B1 | * | 7/2003 | Kirihara | 327/333 |
| 6,677,797 B2 | * | 1/2004 | Kameyama et al. | 327/333 |

* cited by examiner

Primary Examiner—My-Trang Nu Ton
(74) Attorney, Agent, or Firm—Hamilton & Terrile, LLP; Gary W. Hamilton

(57) ABSTRACT

A stable and accurate level shifter for converting voltage levels of signals in CMOS devices. In one embodiment of the invention, the level shifter comprises two legs having transistors operably connected in a source-follower configuration. The biasing of the level shifter is provided by a multistage biasing circuit that comprises a plurality of N-MOS devices. The biasing source can be operated with a single stage or can be configured to combine multiple stages to increase the current (voltage) provided by the biasing circuit. The level shifter of the present invention consumes less power and requires less area on an integrated circuit than prior art level shifters. In addition, the level shifter is insensitive to negative bias temperature instability (NBTI) effects, thereby allowing the level shifter to be highly reliable throughout the life of the part with minimal degradation in the performance and accuracy of the level shifter through time.

24 Claims, 5 Drawing Sheets

STABLE AND ACCURATE CMOS LEVEL SHIFTER

BACKGROUND OF THE INVENTION

1. Field of the Invention

The present invention relates to the field of level shifters for use in electronic circuitry. More specifically, the present invention provides an improved level shifter that is extremely stable and accurate.

2. Description of the Related Art

Advances in complimentary metal oxide semiconductor (CMOS) devices used in electronic circuitry, particularly digital circuitry used in microprocessors, have resulted in CMOS devices operating at lower and lower voltages. Unfortunately, input/output (I/O) circuits have not experienced a commensurate reduction in their operating voltages. I/O voltages are typically higher than core voltage, due to higher voltages required for noise immunity and technology lag of application-specific integrated circuit (ASIC) chips. For instance, in a microprocessor, the core CMOS circuits in many microprocessors are currently operating at 1.3V, while I/O CMOS circuits are operating between 1.5V and 2.5V.

Implementation of an interface between circuits operating at different voltages requires conversion of the signal voltage levels to ensure that the signals are compatible with each other and that static current drain is minimized. This voltage conversion function is accomplished by a "level shifter" circuit. In the lower voltage environment of current CMOS circuits, it is essential that the level shifter is extremely accurate and stable to ensure maximum performance for the I/O circuits and the microprocessor. Current CMOS level shifters, however, are not stable and require CMOS circuits to compensate for variations in voltage and current levels. These additional circuits require additional power and surface area on the integrated circuit. In addition, these circuits introduce complexity to the design and may, in certain circumstances, contribute to the instability of the level shifter.

For a level shifter to operate with the highest degree of stability and efficiency, it is essential to provide an extremely stable biasing source for the CMOS components in the level shifter. Specifically, it is very desirable for the biasing source to operate as an ideal current source. Existing designs utilize P-MOS devices as the principal component in the biasing source. P-MOS devices, however, are particularly susceptible to degradation resulting from the effects of negative bias temperature instability (NBTI). Over time, the operating characteristics of the P-MOS devices can degrade, leading to variation in the performance of the level shifter.

In view of the shortcomings of the prior art, there is a need for an improved stable and accurate level shifter for conversion of signal voltage levels, thereby ensuring maximum performance for both the I/O circuits and the microprocessor.

SUMMARY OF THE INVENTION

The method and apparatus of the present invention provides an improved level shifter that is accurate, stable and resistant to NBTI effects. In one embodiment of the invention, the level shifter comprises two legs having transistors operably connected in a source-follower configuration. The biasing of the level shifter is provided by a multistage biasing circuit that comprises a plurality of N-MOS devices. The biasing source can be operated with a single stage or can be configured to combine multiple stages to increase the current (voltage) provided by the biasing circuit.

In accordance with the present invention, a level shifter having first and second legs comprising a plurality of transistors is operated by receiving a first input signal at a first voltage level on a circuit of a first leg of said level shifter and, generating a first output signal at a second voltage level; receiving a second input signal at a second voltage level on a circuit of said second leg of said level shifter and generating a second output signal at a second voltage level; and controlling operation of said first and second legs of said level shifter with a substantially ideal current source operable to provide stable biasing of transistors in said first and second legs of said level shifter.

The level shifter of the present invention consumes less power and requires less area on an integrated circuit than prior level shifters. In addition, the level shifter is controlled by an extremely stable biasing source that is insensitive to NBTI effects, thereby allowing the level shifter to be highly reliable throughout the life of the part with minimal degradation in the performance and accuracy of the level shifter through time. Using the level shifter of the present invention it is possible to obtain more accurate data signals from the sense amplifier in the level shifter.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
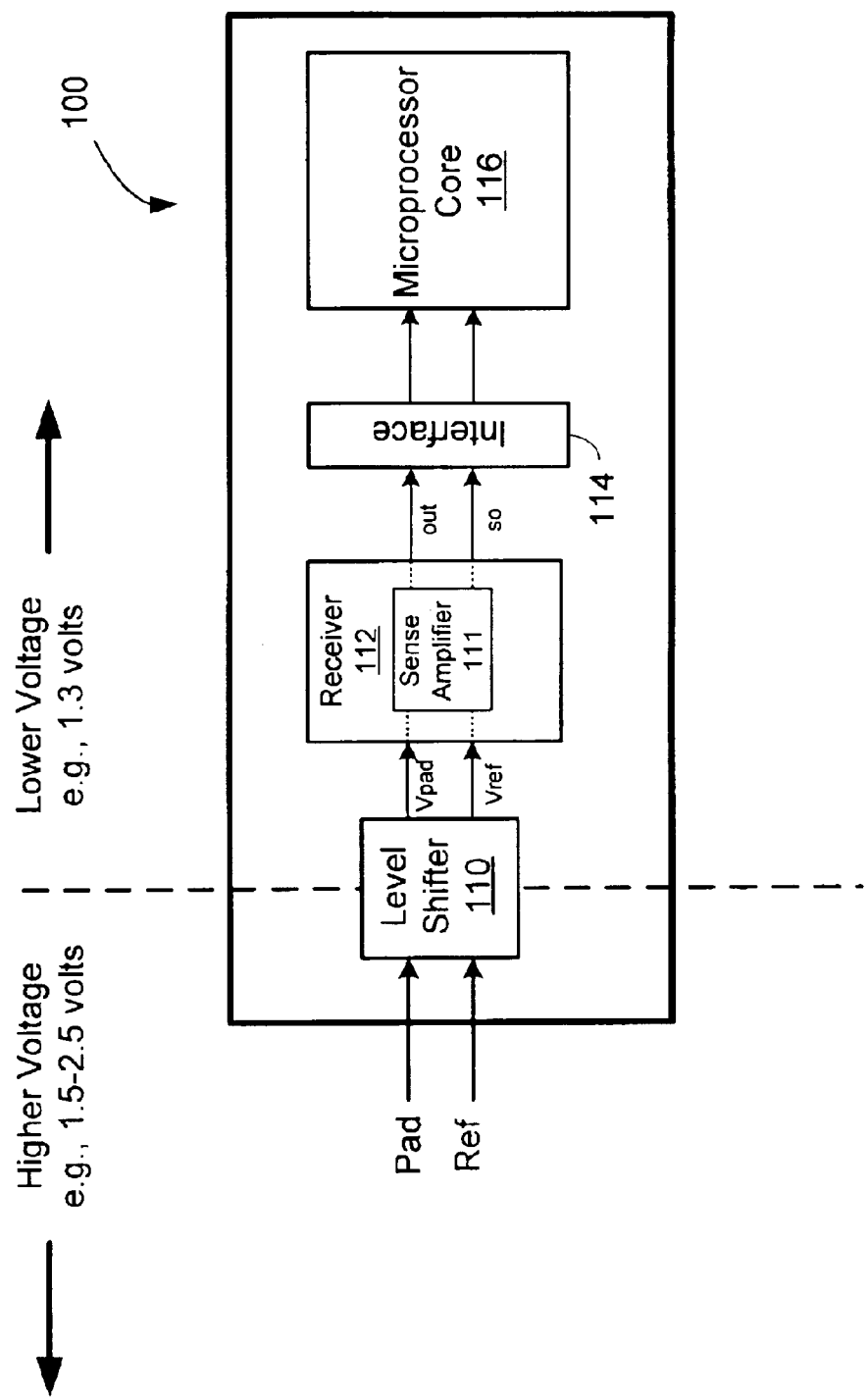
FIG. 1 is an illustration of system components for communicating signals between system components of a circuit at a first voltage level and system components, such as a microprocessor, at a second voltage level.

FIG. 1 is an illustration of an electronic system using a level shifter to accommodate the communication of signals at different voltage levels. More specifically, FIG. 1 illustrates voltage levels that are very often used in current microprocessors 100. For example, it is common for current microprocessor systems to comprise circuits outside the microprocessor that are operating voltage levels of between 1.5 and 2.5 volts, while voltage levels within the microprocessor core are often as low as 1.3 volts. A level shifter 110 is operable to convert incoming signals, such as the pad and ref signals illustrated in FIG. 1, to lower voltage levels as will be discussed in greater detail below. The output signals from the level shifter 110 are passed to a receiver 112, having a sense amplifier 111, and then to an interface 114 that transmits the signals to the microprocessor core 116.

Figure 2:
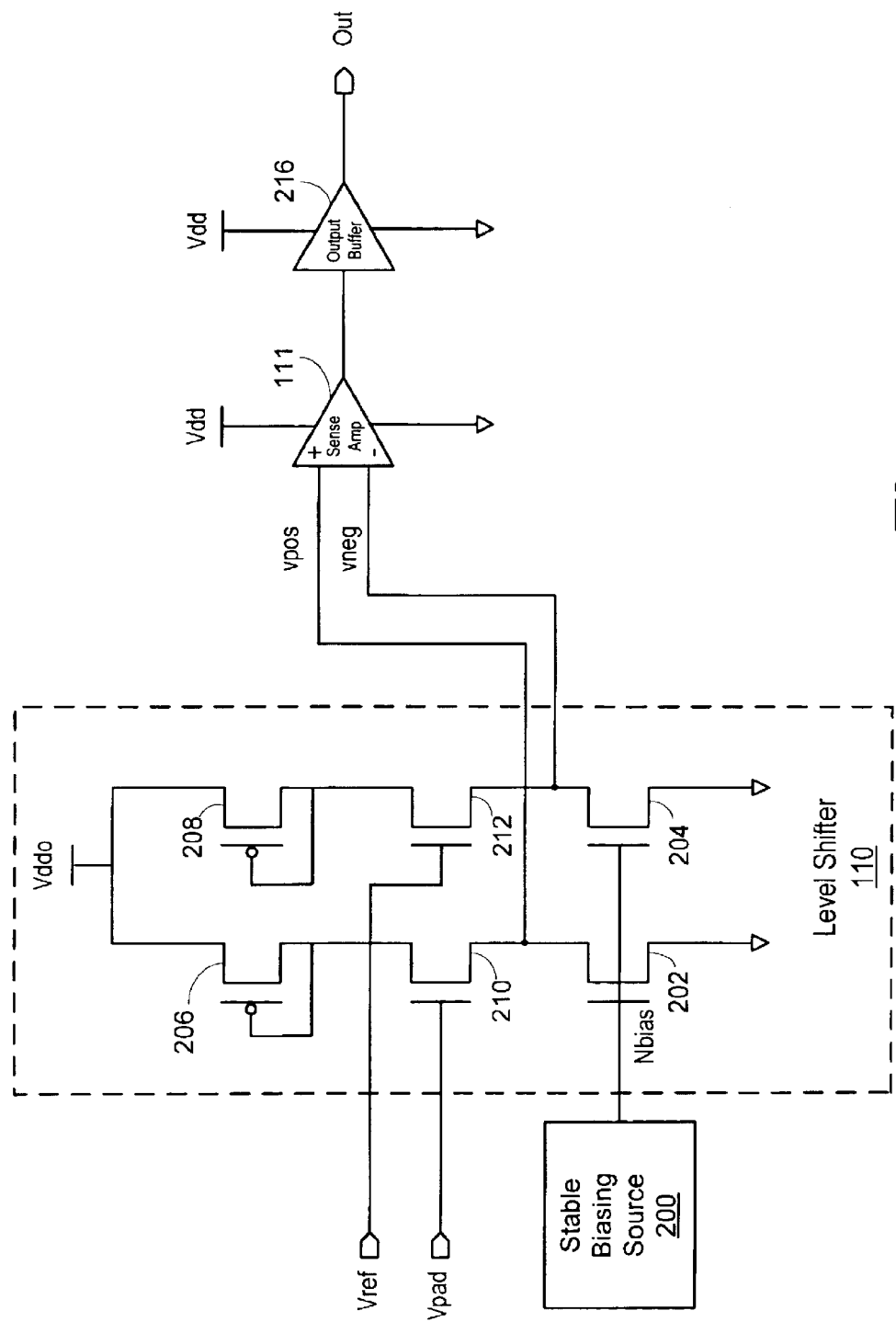
FIG. 2 is a functional block diagram of a level shifter in accordance with the present invention comprising a stable biasing source controlling operation of two stages of the level shifter configured in a source-follower configuration.

FIG. 2 is a functional block diagram of the level shifter of the present invention. The level shifter is broadly comprised of two legs having P-MOS and N-MOS transistors configured in a source-follower configuration. A stable biasing source 200 provides biasing for two N-MOS transistors 202 and 204. The stable biasing source 200 operates as a substantially ideal current source that is resistant to the effects of NBTI. As will be understood by those of skill in the art, an ideal current source provides a constant current regardless of the potential of the voltage sink to which it is attached. Such a current source has an infinite internal resistance, i.e. zero conductance, and an infinite source potential. The stable biasing source 200 allows the level shifter 110 to provide extremely accurate and stable conversion of the voltage levels of the input signals, even when the differences between the input voltage level and the output voltage level are very close in magnitude.

The first leg of the level shifter illustrated in FIG. 2 comprises a P-MOS transistor 206 connected to a N-MOS transistor 210 in a source-follower configuration. The gate of the N-MOS transistor 210 has its gate connected to the Vpad input. The N-MOS transistor 210 generates an output signal Vpos that is provided to the positive input of sense amplifier 111.

The second leg of the level shifter illustrated in FIG. 2 comprises a P-MOS transistor 208 connected to a N-MOS transistor 212 in a source-follower configuration. The gate of the N-MOS transistor 212 has its gate connected to the Vref input. The N-MOS transistor 212 generates an output signal Vneg that is provided to the negative input of the sense amplifier 111. As will be understood by those skilled in the art, it is essential to have a very stable reference voltage, Vref, to ensure that the output of the sense amplifier 111 provides accurate data signals.

Figure 3:
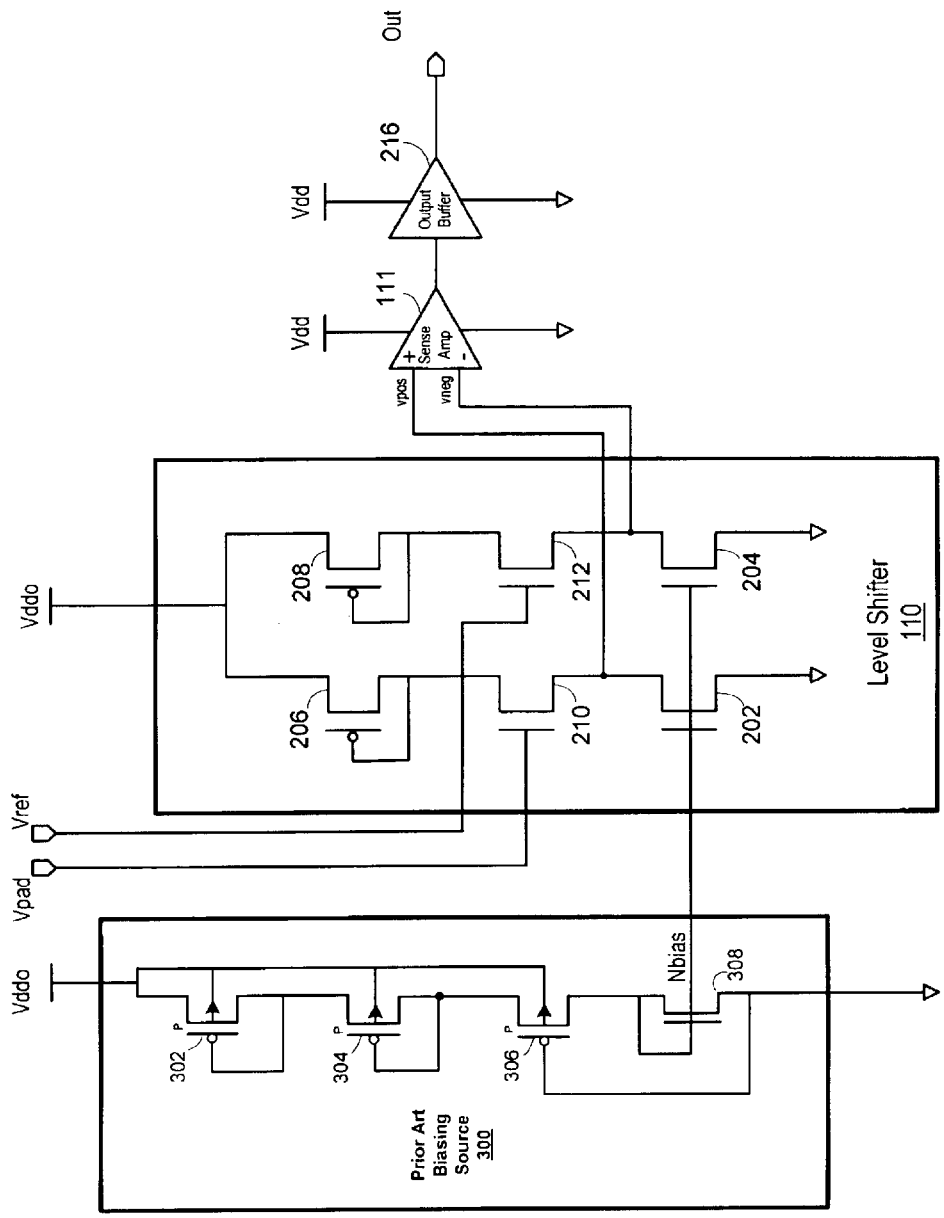
FIG. 3 illustrates a prior art biasing source for controlling the operation of a level shifter.

FIG. 3 illustrates a prior art biasing source 300 used in conjunction with a level shifter 110. The biasing circuit comprises first and second P-type MOS transistors 302 and 304, respectively, that are connected to a third P-type MOS transistor 306 in a cascode arrangement. The output of the P-type transistor 306 provides a biasing source for N-type transistor 308 that serves as the biasing source for the N-type transistors 202 and 204 of the level shifter 110. As will be understood by those of skill in the art, the cascade configuration of the P-type transistors illustrated in FIG. 3 provides rejection of noise that could otherwise be coupled into the level shifter. The P-type MOS transistors used in the prior art biasing circuit 300, however, are susceptible to a number of performance degrading factors, such as body effect, which can reduce the current and, therefore, result in a biasing source that does not have the benefits of an ideal current source. In addition, P-type MOS transistors are susceptible to the effects of negative bias thermal instability (NBTI), which can result in significant performance degradation over time.

Figure 4:
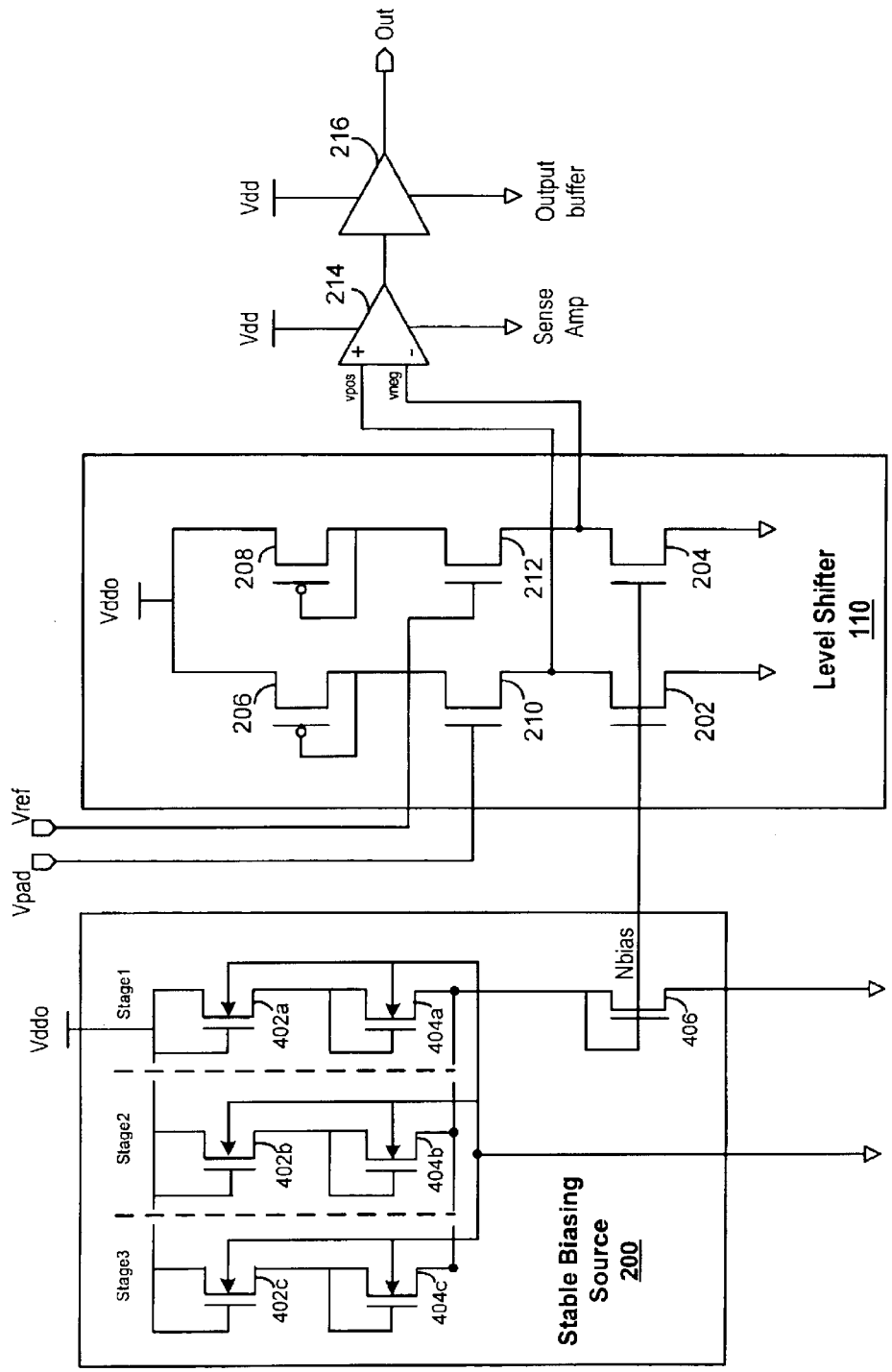
FIG. 4 illustrates system components for implementing the stable biasing source used to control operation of the improved level shifter of the present invention.

FIG. 4 illustrates the functional components of the stable biasing source 200 used in the improved level shifter of the present invention. The stable biasing source 200 comprises 3 stages of N-type MOS transistors. For example stage 1 comprises N-type MOS transistors 402a and 404a that are connected to N-type transistors 406 that provides biasing control for the N-type MOS transistors 202 and 204 of the level shifter 110. Likewise, stage 2 of the biasing source comprises N-type MOS transistors 402b, 404b and stage 3 comprises N-Type MOS transistors 402c and 404c. The operational characteristics of the transistors in stage 2 are selected such that stage 2 is capable of generating 100 percent of the current generated by stage 1. The operational characteristics of the transistors in stage 3 are selected such that stage 3 is capable of generating approximately 25 percent of the current generated in stage 1. The three stages of the stable biasing source 200 can be combined, if needed, to generate additional current to ensure stable operation of the level shifter 110. It will be appreciated by those skilled in the art that the percentages of additional current for each of the stages discussed above can be modified to adapt the stable current source for use in a number of different applications.

The configuration illustrated in FIG. 4 ensures that the N-type MOS transistor 406 operates as an essentially ideal current source, thereby providing a stable and accurate biasing source to control the N-type MOS transistors 202 and 204 in the level shifter 110. The biasing source 200 of the present invention differs from prior art designs in that it uses N-type MOS transistors as opposed to the P-type MOS transistors used in prior art biasing sources. As discussed above, P-type MOS transistors are susceptible to degradation resulting from body effect and also from the adverse effects of negative bias temperature instability (NBTI). It will be appreciated, therefore, by those of skill in the art that the stable biasing source 200 used in the CMOS level of the present invention represents a significant improvement over the prior art.

Figure 5:
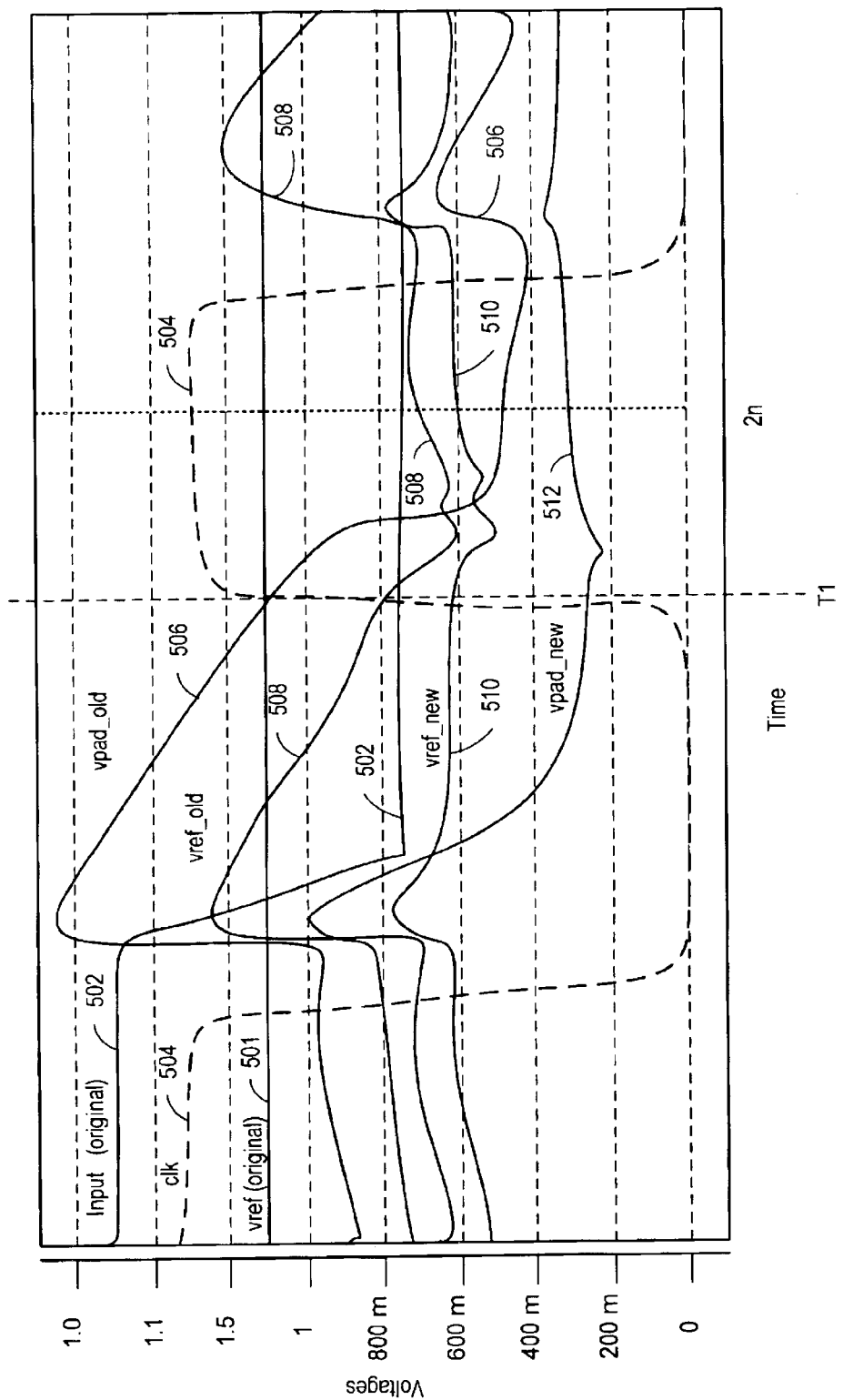
FIG. 5 is a graphical illustration of the improved performance curves of the reference voltage and pad voltages obtained using the improved level shifter of the present invention.

FIG. 5 is a graphical illustration of performance curves showing the advantages of the improved level shifter of the present invention. Specifically, FIG. 5 compares performance curves for a level shifters having a biasing source using P-type MOS that are susceptible to NBTI effects, as discussed above, and performance curves for a level shifter having a biasing source using the N-type MOS devices in accordance with the present invention. The illustration in FIG. 5 relates to an input signal 502 that is level shifted downward by a quantity approximately equal to Vtn. A clock signal 504 provides a timing reference for the various system components, including the sampling function of the sense amplifier 111. The performance curves for Vpad_old 506 and Vref_old 508 correspond to the performance characteristics of Vpad and Vref for a level shifter that operates in conjunction with a prior art biasing source using P-type MOS devices that are subject to the NBTI effects discussed hereinabove. The performance curves for Vpad_new and Vref_new correspond to the performance characteristics of Vpad and Vref for a level shifter that operates in conjunction with the stable biasing source using N-type MOS devices in accordance with the present invention.

As was discussed above, it is essential to have a very stable reference voltage, Vref, to ensure that the output of the sense amplifier 111 provides accurate data signals. Referring to FIG. 5, however, it can be seen that Vpad_old 506 and Vref_old 508 have significant fluctuations that can lead to erroneous data signals. For example, if data is sampled at time interval T1, the Vpad_old signal 506 is at a higher voltage than the Vref_old signal 508. In a timing reference with respect to a rising edge of the clock signal, this could be a failure, since at T1, it does not record a data change from high to low. It is apparent, therefore, that a prior art level shifter using a biasing source that is susceptible to NBTI effects can cause the data output of the sense amplifier 111 to be erroneous. By comparison, it can be seen that the Vref_new signal 510 and the Vpad_new signal 512 are subject to much less fluctuation. In addition, the Vref_new signal 510 and the Vpad_new signal 512 maintain a substantially stable relative voltage relationship once the input signal 502 has transitioned to the lower voltage level. At time interval T1, for example, the Vref_new signal 510 is at a higher voltage level than the Vpad_new signal 512, as it should be. These two signals can be seen to have the same voltage relationship at time interval T2 and, in fact, have a difference in magnitude of approximately 300 mV at both time intervals. Because the Vref_new signal 510 is stable and maintains a consistent voltage relationship with the Vpad_new signal 512, the sense amplifier 111 will provide more accurate data output signals.

In view of the above detailed description of the invention and associated drawings, other modifications and variations will now become apparent to those skilled in the art. It should also be apparent that such other modifications and variations may be effected without departing from the spirit and scope of the invention.

What is claimed is:

1. A level shifter comprising:
   a first leg comprising a plurality of transistors operable to receive a first input signal at a first voltage level and to generate a first output signal at a second voltage level;
   a second leg comprising a plurality of transistors operable to receive a second input signal at said first voltage level and to generate a second output signal at said second voltage level; and
   a biasing source comprising a substantially ideal current source operable to provide stable biasing of said transistors in said first and second legs of said level shifter.

2. The level shifter according to claim 1, wherein said biasing source comprises only N-MOS transistors.

3. The level shifter according to claim 1, wherein said first signal comprises a Vref signal.

4. The level shifter according to claim 1, wherein said second signal comprises a Vpad signal.

5. The level shifter according to claim 1, wherein said biasing source comprises first and second stages, said first stage providing a substantially ideal current source at a first current level and said second stage providing a substantially ideal current source at a current level approximately equal to said first stage.

6. The level shifter according to claim 5, wherein said biasing source further comprises a third stage.

7. The level shifter according to claim 5, wherein said second stage comprises only N-MOS transistors.

8. The level shifter according claim 6, wherein said third stage comprises only N-MOS transistors.

9. A method of operating a level shifter having first and second legs comprising a plurality of transistors, said method comprising:
   receiving a first input signal at a first voltage level on a first circuit of said first leg of said level shifter and generating a first output signal at a second voltage level;
   receiving a second input signal at a second voltage level on said second leg of said level shifter and generating a second output signal at a second voltage level; and
   controlling operation of said level shifter with a substantially ideal current source operable to provide stable biasing of transistors in said first and second legs of said level shifter.

10. The method according to claim 9, wherein said biasing source comprises only N-MOS transistors.

11. The method according to claim 9, wherein said first signal comprises a Vref signal.

12. The method according to claim 9, wherein said second signal comprises a Vpad signal.

13. The method according to claim 9, wherein said biasing source comprises first and second stages, said first stage providing a substantially ideal current source at a first current level and said second stage providing a substantially ideal current source at a current level approximately equal to said first stage.

14. The method according to claim 13, wherein said biasing source further comprises a third stage.

15. The method according to claim 13, wherein said second stage comprises only N-MOS transistors.

16. The method according claim 14, wherein said third stage comprises only N-MOS transistors.

17. A microprocessor comprising,
   a microprocessor core;
   a receiver having a sense amplifier for detecting an incoming data signal and transferring said incoming signal to said microprocessor core, and
   level shifter comprising:
      a first leg comprising a plurality of transistors operable to receive a first input signal at a first voltage level and to generate a first output signal at a second voltage level;
      a second leg comprising a plurality of transistors operable to receive a second input signal at said first voltage level and to generate a second output signal at said second voltage level; and
      a biasing source comprising a substantially ideal current source operable to provide stable biasing of said transistors in said first and second legs of said level shifter.

18. The level shifter according to claim 17, wherein said biasing source comprises only N-MOS transistors.

19. The level shifter according to claim 17, wherein said first signal comprises a Vref signal.

20. The level shifter according to claim 17, wherein said second signal comprises a Vpad signal.

21. The level shifter according to claim 17, wherein said biasing source comprises first and second stages, said first stage providing a substantially ideal current source at a first current level and said second stage providing a substantially ideal current source at a current level equal to said first stage.

22. The level shifter according to claim 21, wherein said biasing source further comprises a third stage.

23. The level shifter according to claim 21, wherein said second stage comprises only N-MOS transistors.

24. The level shifter according claim 22, wherein said third stage comprises only N-MOS transistors.

* * * * *